United States Patent
Syau

(10) Patent No.: US 7,037,774 B1
(45) Date of Patent: May 2, 2006

(54) SELF-ALIGNED CONTACT STRUCTURE AND PROCESS FOR FORMING SELF-ALIGNED CONTACT STRUCTURE

(75) Inventor: Tsengyou Syau, Portland, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 10/970,074

(22) Filed: Oct. 21, 2004

(51) Int. Cl.
*H01L 21/8238* (2006.01)

(52) U.S. Cl. ........................ 438/230; 438/229; 438/637

(58) Field of Classification Search ................ 438/637, 438/638, 672, 233, 586, 184, 230, 229
See application file for complete search history.

(56) References Cited

U.S. PATENT DOCUMENTS

| | | | |
|---|---|---|---|
| 5,874,359 A * | 2/1999 | Liaw et al. ................. | 438/640 |
| 6,074,955 A * | 6/2000 | Lin et al. ................... | 438/710 |
| 6,165,879 A | 12/2000 | Lee et al. | |
| 6,225,203 B1 * | 5/2001 | Liu et al. ................... | 438/595 |
| 6,255,168 B1 * | 7/2001 | Gau .......................... | 438/262 |
| 6,479,873 B1 | 11/2002 | Yoshiyama et al. | |
| 6,498,088 B1 | 12/2002 | Trivedi | |
| 6,534,414 B1 | 3/2003 | Wang et al. | |
| 6,777,305 B1 * | 8/2004 | Lee et al. ................... | 438/396 |
| 6,787,465 B1 * | 9/2004 | Juengling ................... | 438/684 |
| 6,803,318 B1 * | 10/2004 | Qiao et al. ................. | 438/700 |
| 2004/0038546 A1 * | 2/2004 | Ko ............................ | 438/710 |

* cited by examiner

*Primary Examiner*—S. V. Clark
(74) *Attorney, Agent, or Firm*—Kenneth Glass; Glass & Associates

(57) ABSTRACT

A CMOS structure and a process for forming CMOS devices are disclosed in which gate film stacks are formed over a semiconductor substrate. A barrier layer and a first dielectric film are formed such that they extend over the gate film stacks. Metal lines are formed over the pre-metal dielectric film and spacers are formed that extend on opposite sides of the metal lines. A second dielectric film is formed that extends over the metal lines. A masking structure is formed that defines a contact opening. Selective etch processes are performed to form a self-aligned contact opening, with the adjacent metal lines and spacers aligning the self-aligned contact opening between adjacent gate film stacks. A metal layer is then deposited and planarized to form a self-aligned contact. The masking structure can also define additional contact openings, which are simultaneously etched and filled with metal to form borderless, strapped and shared contacts. These borderless contacts, contacts and shared contacts can either be aligned on one side or can be positioned using only the masking structure.

16 Claims, 14 Drawing Sheets

SELF-ALIGNED CONTACT STRUCTURE AND PROCESS FOR FORMING SELF-ALIGNED CONTACT STRUCTURE

FIELD OF THE INVENTION

The present invention relates to the field of semiconductor devices. More particularly, the present invention relates to Complimentary Metal-Oxide Semiconductor (CMOS) manufacturing processes.

BACKGROUND ART

In sub-micron Complimentary Metal-Oxide Semiconductor (CMOS) manufacturing self-aligned contact (SAC) technology has been successfully used to achieve chip size reduction. In conventional SAC processes, gate film stacks are formed that include a hardmask or "capping layer" that extends over each gate electrode. An etch stop layer (e.g., silicon nitride) is deposited over the substrate and a pre-metal dielectric film is formed over the etch stop layer. An etch is then performed to form contact openings that extend through the pre metal dielectric film. This etch stops on the etch stop layer. The exposed portions of the etch stop layer are then removed, exposing the structure that is to be contacted. A metal layer is then deposited and planarized to complete the self-aligned contact. The etch stop layer and the capping layer align the contact with the structure to be contacted, preventing current leakage that could result from improper alignment.

Though the capping layer is effective for preventing shorting of the self-aligned contact to the gate electrode, it adds significant height to the gate film stack. Because of the close spacing between gate film stacks, this added height results in a structure that is difficult to fill with dielectric, producing voids that can cause bridging defects. In addition, the capping layer must be removed in order to contact gate electrodes, adding an etch step and an additional mask to the fabrication process.

Accordingly there is a need for a CMOS structure and a process for forming CMOS devices that gives good gap-fill characteristics between adjacent gate film stacks. Also, there is a need for a CMOS structure and a process for forming CMOS devices that do not have bridging defects. In addition, there is a need for a process for forming CMOS devices that reduces the number of masking and etching steps. The present invention meets the above needs.

DISCLOSURE OF THE INVENTION

A CMOS structure and a process for forming a Complimentary Metal Oxide Semiconductor (CMOS) device are disclosed in which metal lines and spacers that extend on opposite sides of each metal line are used for aligning a self-aligned contact opening. First, gate film stacks are formed that include gate electrodes. A barrier layer and a first dielectric film are formed such that they extend over the gate film stacks. Metal lines are then formed over the pre-metal dielectric film and spacers are formed that extend on opposite sides of the metal lines. A second dielectric film is formed that extends over the metal lines. A masking structure is formed that defines contact openings. A first selective etch process is performed that preferentially removes the material in the first and second dielectric films, over the material in the spacers and the material in the barrier layer. Portions of adjacent metal lines are aligned with adjacent gate film stacks such that a self-aligned contact opening is formed that is aligned between the adjacent gate film stacks. A second selective etch is then performed so as to etch through the exposed portion of the barrier layer so as to expose a portion of the surface of the semiconductor substrate. A metal layer is then deposited and planarized to form a self-aligned contact.

The masking structure also defines additional contact openings such that additional contacts openings are simultaneously formed. These additional contact openings form borderless contacts, strapped contacts and shared contacts. These borderless contacts, strapped contacts and shared contacts can either be aligned on one side using metal lines and spacers, or can be positioned using only the masking structure.

The gate film stacks of the present invention do not include a hard mask layer that overlies the gate electrode as is required in prior art self-aligned processes. This reduced height of gate film stacks in the core region, giving better gap-fill and preventing the formation of voids that can cause bridging defects. In addition, since there is no hard mask "capping" layer in each gate film stack, there is no need to perform a hard-mask removal process prior to forming contacts that couple to gate electrodes as is required in prior art self-aligned contact processes that include a capping layer.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
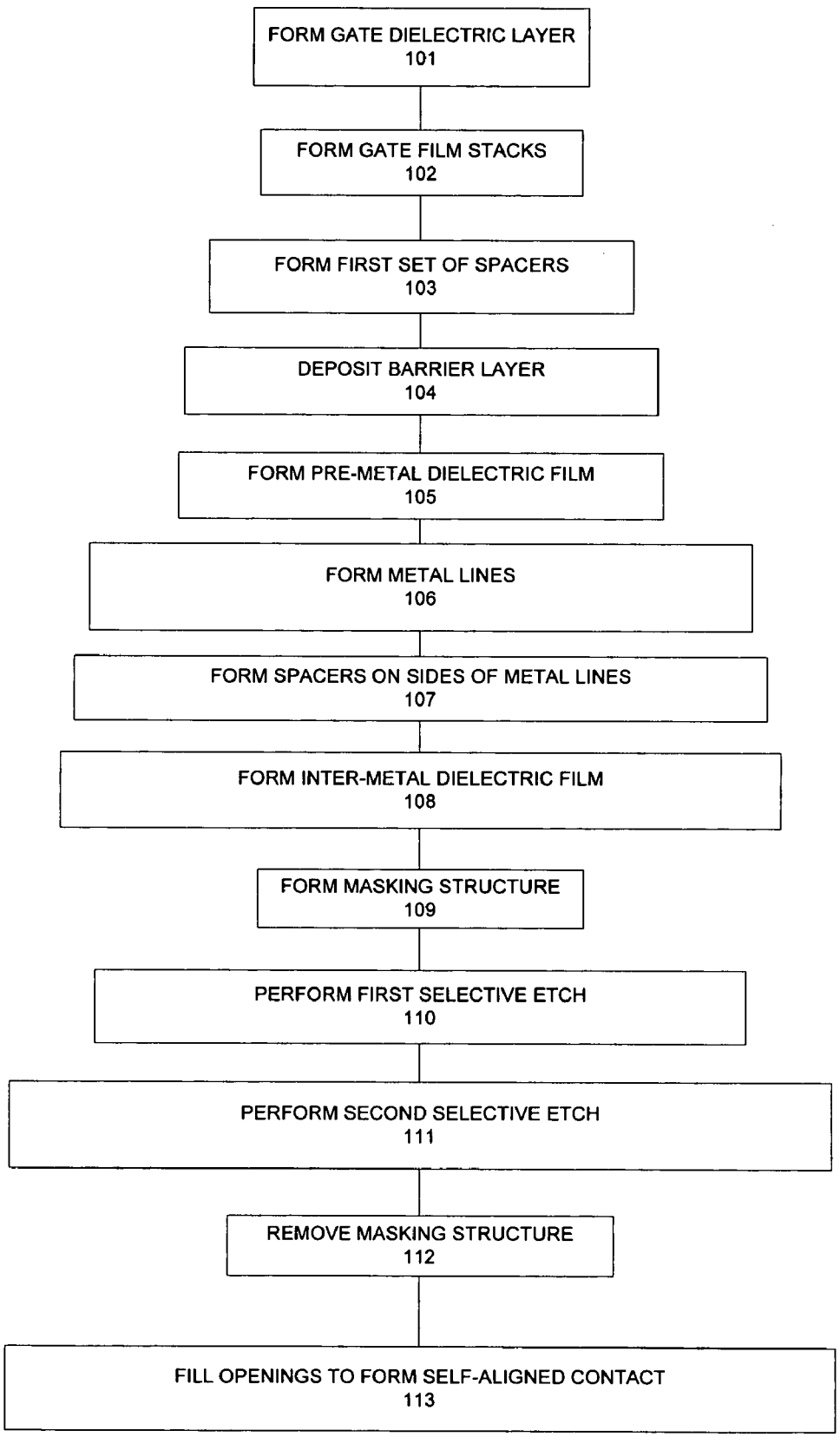
FIG. 1 illustrates a process for forming a CMOS structure in accordance with an embodiment of the present invention.

FIG. 1 illustrates a process for forming a CMOS structure that includes self-aligned contacts. As shown by step 101, a gate dielectric layer is formed over a semiconductor substrate. The gate dielectric layer can be formed by depositing or growing a thin layer (e.g., 10 to 80 Angstroms) of silicon dioxide ($SiO_2$), or other type of dielectric, on the semiconductor substrate.

Figure 2:
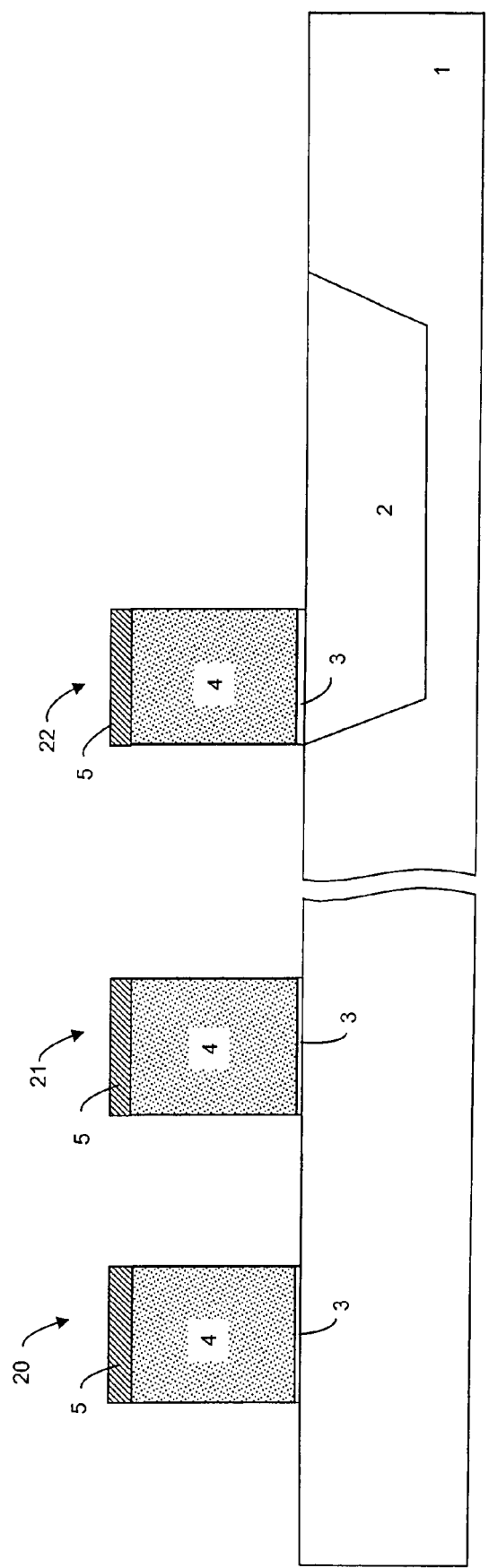
FIG. 2 shows a semiconductor substrate after a gate dielectric layer has been deposited thereover, and after three gate film stacks have been formed thereover in accordance with an embodiment of the present invention.

As shown by step 102, gate film stacks are formed. In the present embodiment, gate film stacks are formed that include multiple conductive layers, including a top conductive layer that is referred to hereinafter as a "gate electrode." In the present embodiment, gate dielectric layer 3, conductive layer 4 and gate electrode layer 5 are deposited over semiconductor substrate 1. Layers 3–5 are then patterned by depositing, exposing and developing a photoresist layer, and performing an etch process, to form gate film stacks 20–22 which are shown in FIG. 2. In the present embodiment shallow trench isolation regions 2 are formed in the semiconductor substrate for isolating device regions.

In the present embodiment conductive layer 4 includes one or more layers of polysilicon that immediately overlie gate dielectric layer 3. In the present embodiment conductive layer 4 has a thickness of 500 to 2,000 Angstroms and is formed by depositing one or more layers of polysilicon, using a chemical vapor deposition process. Alternatively, conductive layer 4 can be formed by depositing amorphous silicon in a furnace. In one embodiment conductive layer 4 is a single layer of polysilicon that is deposited using a chemical vapor deposition process, and that has a thickness of approximately 650 Angstroms.

In the present embodiment gate electrode 5 is refractory metal silicide that immediately overlies conductive layer 4. Gate electrode 5 can include one or more layers, with individual layers formed of cobalt silicide, tungsten silicide, titanium silicide, tantalum silicide, molybdeum silicide, niobium silicide, rhenium silicide, vanadium silicide, chromium silicide, zirconium silicide or hafnium silicide. Gate electrode 5 can also be formed using non-refractory-metal suicides, or nonmetal suicides that have sufficient conductivity. In one embodiment gate electrode 5 is a single layer of tungsten silicide ($WSi_x$) that is deposited using a Chemical Vapor Deposition (CVD) process and has a thickness of 600 to 1,000 Angstroms. In one specific embodiment gate electrode 5 is a single layer of tungsten silicide ($WSi_x$) that has a thickness of approximately 650 Angstroms.

Gate film stacks 20–22 include only conductive layer 4 and gate electrode 5, which overlie gate dielectric layer 3. They do not include a hard mask or "capping layer" that extends over the gate electrode. This produces gate film stacks 20–22 that are shorter than prior art gate film stacks that include a capping layer that extends over the gate electrode. In one embodiment gate film stacks 20–22 extend to a height of 1400 Angstroms or less, above the top surface of semiconductor substrate 1.

Figure 3:
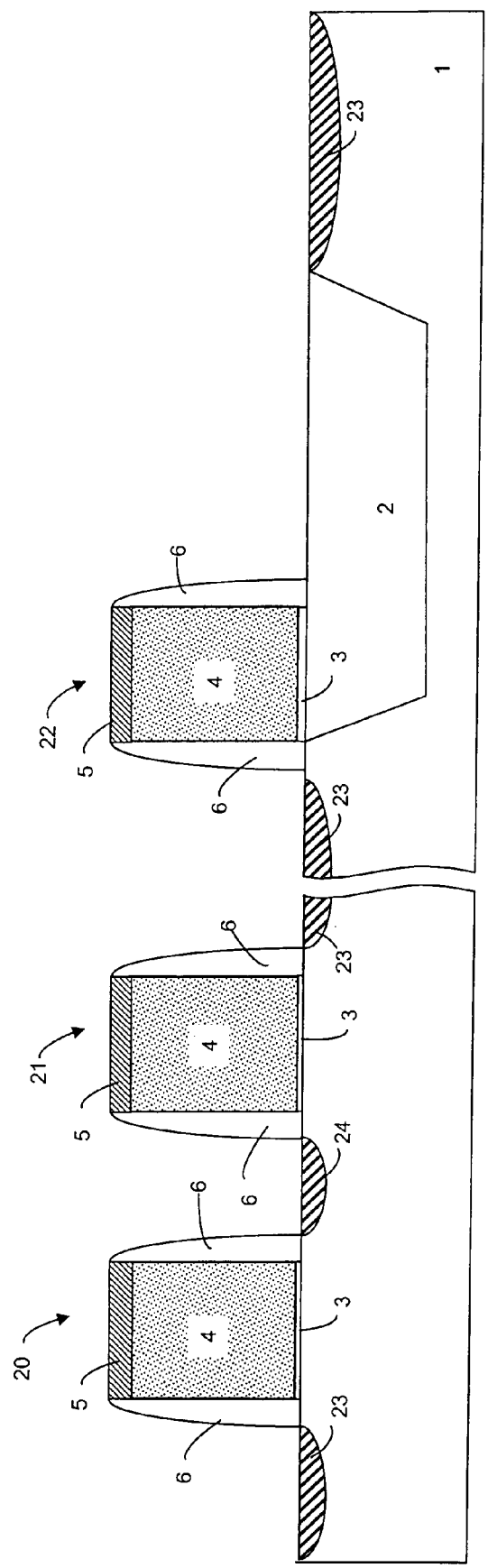
FIG. 3 shows the structure of FIG. 2 after spacers have been formed that extend on opposite sides of each gate film stack in accordance with an embodiment of the present invention.

Referring to step 103 of FIG. 1, a first set of spacers are formed. In the embodiment shown in FIG. 3 spacers 6 are formed that extend on opposite sides of each gate film stack 20–22. In one embodiment, spacers 6 are formed by depositing a layer of silicon nitride (SiN) having a thickness of from 200 to 1,000 Angstroms over the semiconductor substrate, and performing a reactive ion etch.

In the present embodiment implantation processes are performed so as to form source/drain implant regions 23–24. The processes for forming source/drain implant regions 23–24 will vary depending on the device requirements of the CMOS devices to be formed. In the present embodiment implant region 24 is a common source/drain region that extends between gate film stacks 20–21. However, it is appreciated that, alternatively implant region 24 could include separate source/drain regions.

Figure 4:
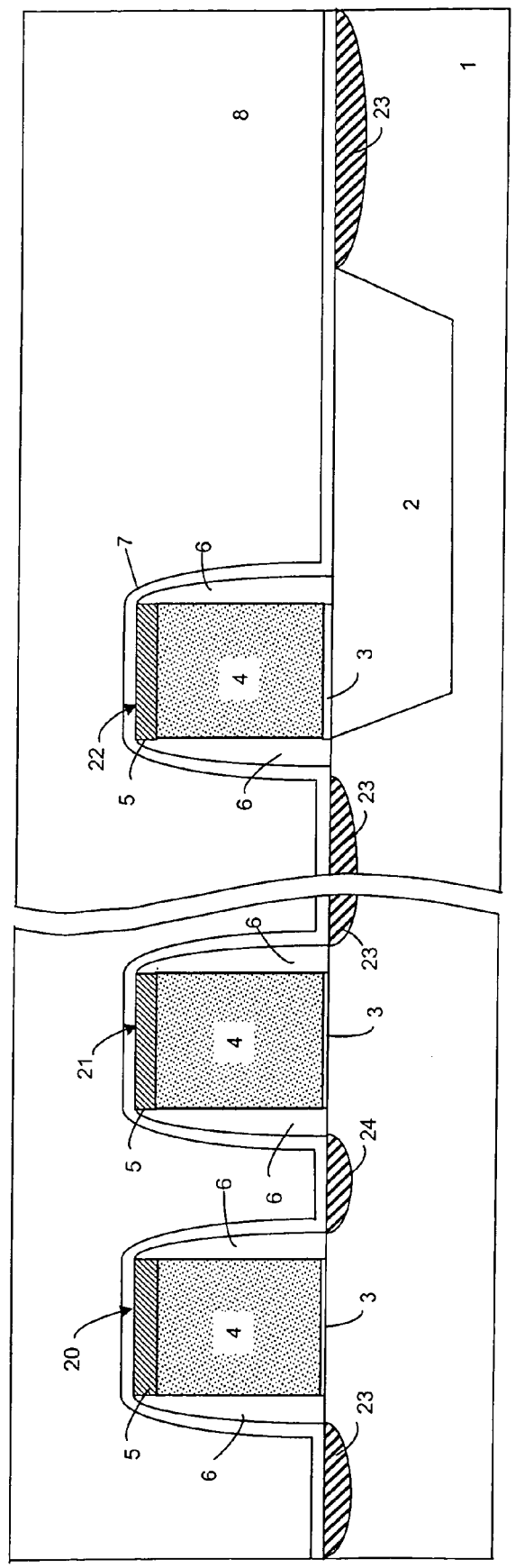
FIG. 4 shows the structure of FIG. 3 after an implant process has been performed so as to form source/drain regions, after a barrier layer has been deposited and after a pre-metal dielectric film has been formed that extends over the barrier layer in accordance with an embodiment of the present invention.

As shown by step 104 a barrier layer is formed. In the embodiment shown in FIG. 4, barrier layer 7 is formed that extends immediately over gate film stacks 20–22 and immediately over spacers 6. The term "barrier layer," as used in the present application, includes any layer of dielectric material that can be selectively etched relative to the material in pre-metal dielectric film 8, and specifically includes silicon nitride, silicon oxide, and silicon oxynitride. Barrier layer 7 can be one or more layers of dielectric material, with each layer formed of silicon nitride, silicon oxide, silicon oxynitride, or other dielectric material that can act as an etch stop relative to the material in pre-metal dielectric film 8. In the present embodiment, barrier layer 7 is formed by depositing a single layer of silicon nitride, having a thickness of approximately 200 Angstroms.

A pre-metal dielectric film is formed as shown by step 105. In the embodiment shown in FIG. 4 pre-metal dielectric film 8 is formed that immediately overlies barrier layer 7. In one embodiment pre-metal dielectric film has a thickness such that it extends from 1,000 to 4,000 Angstroms over the top of gate film stacks 20–22. Pre-metal dielectric film 8 can be one or more layers of dielectric material, with each layer formed of doped oxide, borophosphosilica glass (BPSG), undoped silica glass (USG), spin on glass (SOG), borosilica glass (BSG), phosphosilicate glass (PSG), tetraethylorthosilicate (TEOS), oxynitride or other dielectric material that can be selectively etched relative to the material in barrier layer 7.

In one specific embodiment a pre-metal dielectric film 8 is formed that has a hard, planar upper surface. In this embodiment one or more layers of soft conformal dielectric material such as doped oxide, BPSG, USG, BSG, PSG or some combination of these materials, are deposited to form a dielectric film that is planarized using a chemical mechanical polishing process. One or more layers of relatively hard dielectric material such as TEOS and/or silicon oxynitride are then deposited to form the hard upper surface.

Figure 5:
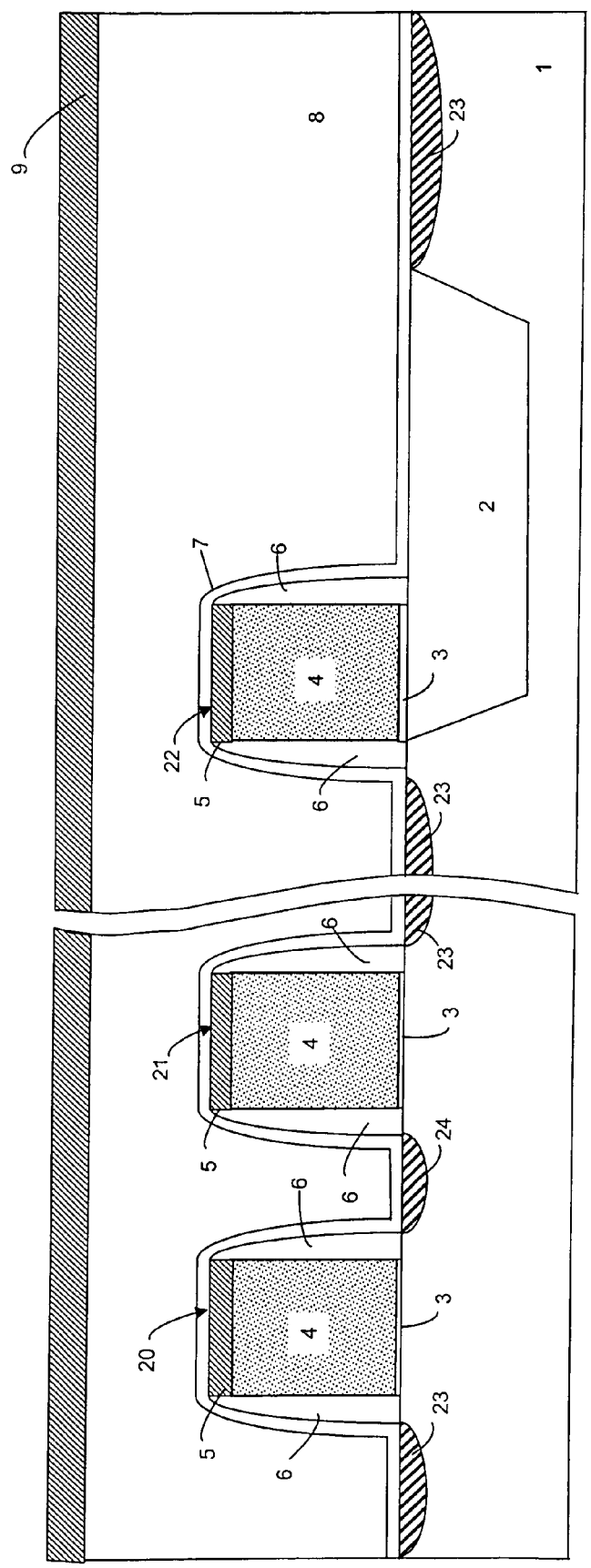
FIG. 5 shows the structure of FIG. 4 after a metal layer has been deposited thereover in accordance with an embodiment of the present invention.
Figure 6:
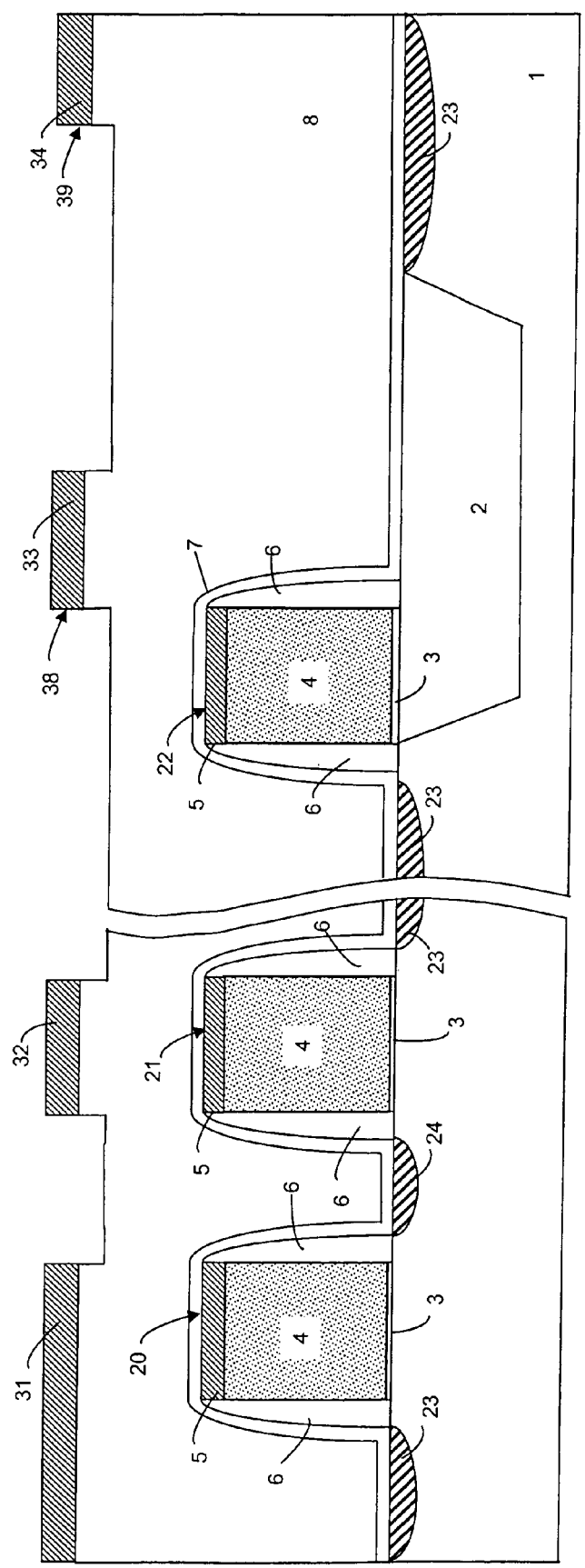
FIG. 6 shows the structure of FIG. 5 after mask and etch steps have been performed so as to pattern the metal layer to form metal lines using an etch process in which over-etch removes some of the pre-metal dielectric film in accordance with an embodiment of the present invention.

As shown by step 106, metal lines are formed over the pre-metal dielectric film. In the embodiment shown in FIGS. 5–6, metal lines 31–34 are formed that extend immediately over pre-metal dielectric film 8. In one embodiment metal lines 31–34 are formed by depositing metal layer 9 over pre-metal dielectric film 8 and performing mask and etch steps to pattern metal layer 9. Metal layer 9 can be one or more layer of metal or metal alloy. In the present embodiment metal layer 9 is a single layer of titanium nitride or tungsten. Alternatively, aluminum-copper alloy can be used. Metal layer 9 can be patterned by depositing a layer of photoresist, exposing and developing the layer of photoresist to form a patterned layer of photoresist, and performing an etch process. In the present embodiment the etch process is performed so as to achieve over etch, partially etching portions of pre-metal dielectric film 8 so as to form notches in the top surface of pre-metal dielectric film 8.

Figure 7:
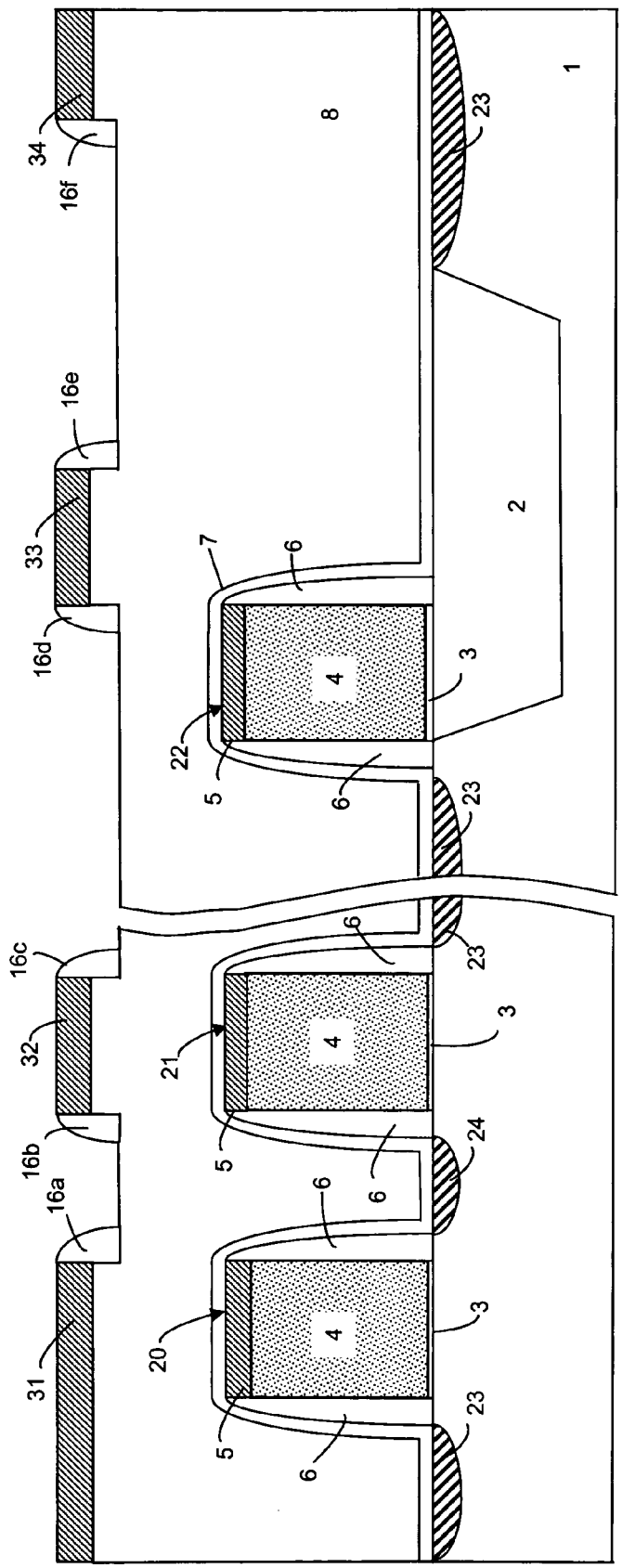
FIG. 7 shows the structure of FIG. 6 after spacers have been formed that extend on each side of each metal line in accordance with an embodiment of the present invention.

Referring now to step 107 of FIG. 1, a second set of spacers are formed. In the embodiment shown in FIG. 7, spacers 16a–f are formed that extend on opposite sides of metal lines 31–34. In one embodiment, spacers 16a–f are formed by depositing a layer of silicon nitride (SiN) using a Low Pressure Chemical Vapor Deposition (LPCVD) process and performing a reactive ion etch. The over-etch during the patterning of metal layer 9 extends the depth of the sidewall against which spacers 16a–f are formed, producing spacers having a thickness that is greater than the thickness of metal lines 31–34. In the present embodiment the over-etch during the patterning of metal layer 9 is varied to control the width of the resulting spacers. More particularly, by increasing the amount of over-etch, the depth of the sidewall against which spacers 16a–f are formed increases, giving spacers 16a–f having increased width.

Figure 8:
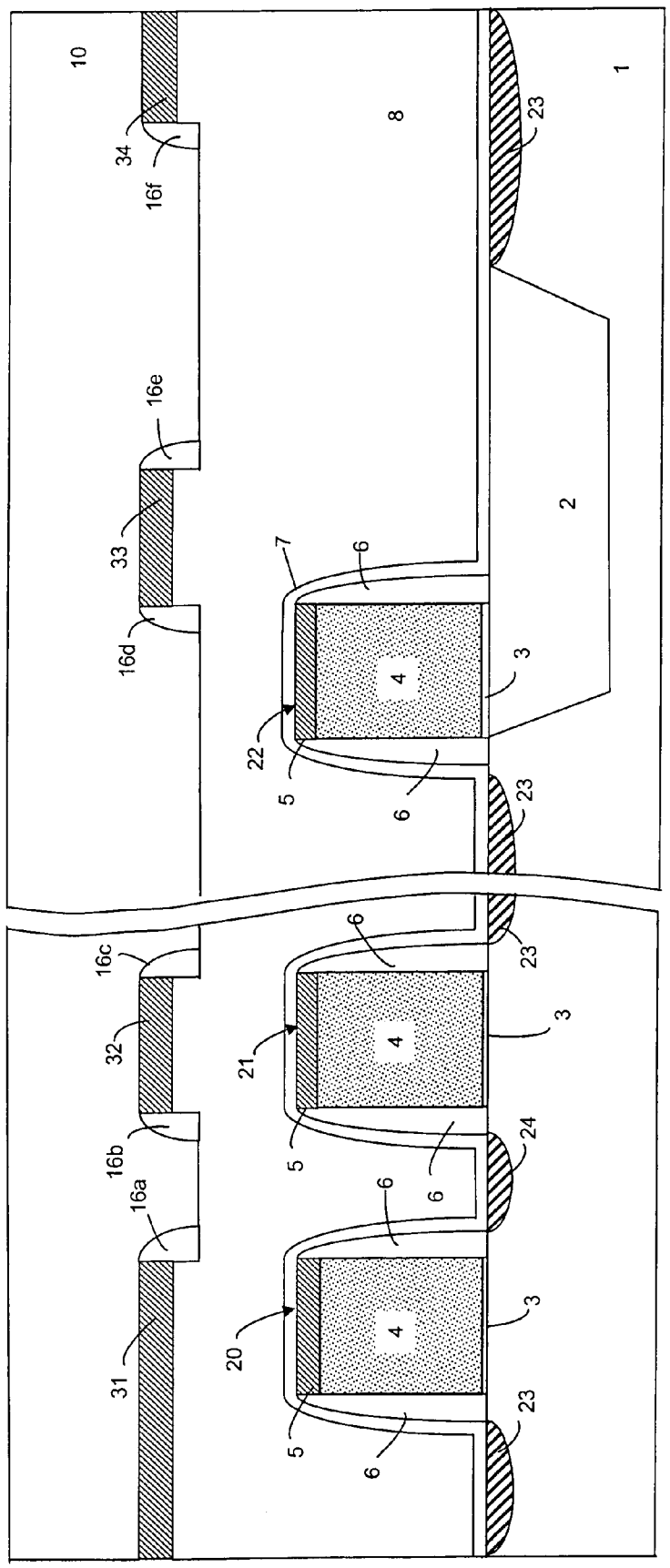
FIG. 8 shows the structure of FIG. 7 after formation of a dielectric film that extends immediately over both the metal lines and the spacers in accordance with an embodiment of the present invention.

An inter-metal dielectric film is formed as shown by step 108. In the embodiment shown in FIG. 8 inter-metal dielectric film 10 is formed that immediately overlies metal lines 31–34 and spacers 16a–f. In one embodiment inter-metal dielectric film 10 is a layer of oxide that has a thickness of from 1,000 to 4,000 Angstroms. Inter-metal dielectric film 10 can be one or more layers of dielectric material, with each layer formed of oxide, doped oxide, borophosphosilica glass (BPSG), undoped silica glass (USG), spin on glass (SOG), borosilica glass (BSG), phosphosilicate glass (PSG) or tetraethylorthosilicate (TEOS), oxynitride or other dielectric material that can be selectively etched relative to the material in barrier layer 7.

In one specific embodiment an inter-metal dielectric film 10 is formed that has a hard, planar upper surface. In this embodiment one or more layers of soft conformal dielectric material such as doped oxide, BPSG, USG, BSG, PSG or some combination of these materials, are deposited to form a dielectric film that is planarized using a chemical mechanical polishing process. One or more layers of relatively hard dielectric material such as TEOS and/or silicon oxynitride are then deposited to form the hard upper surface.

Figure 9:
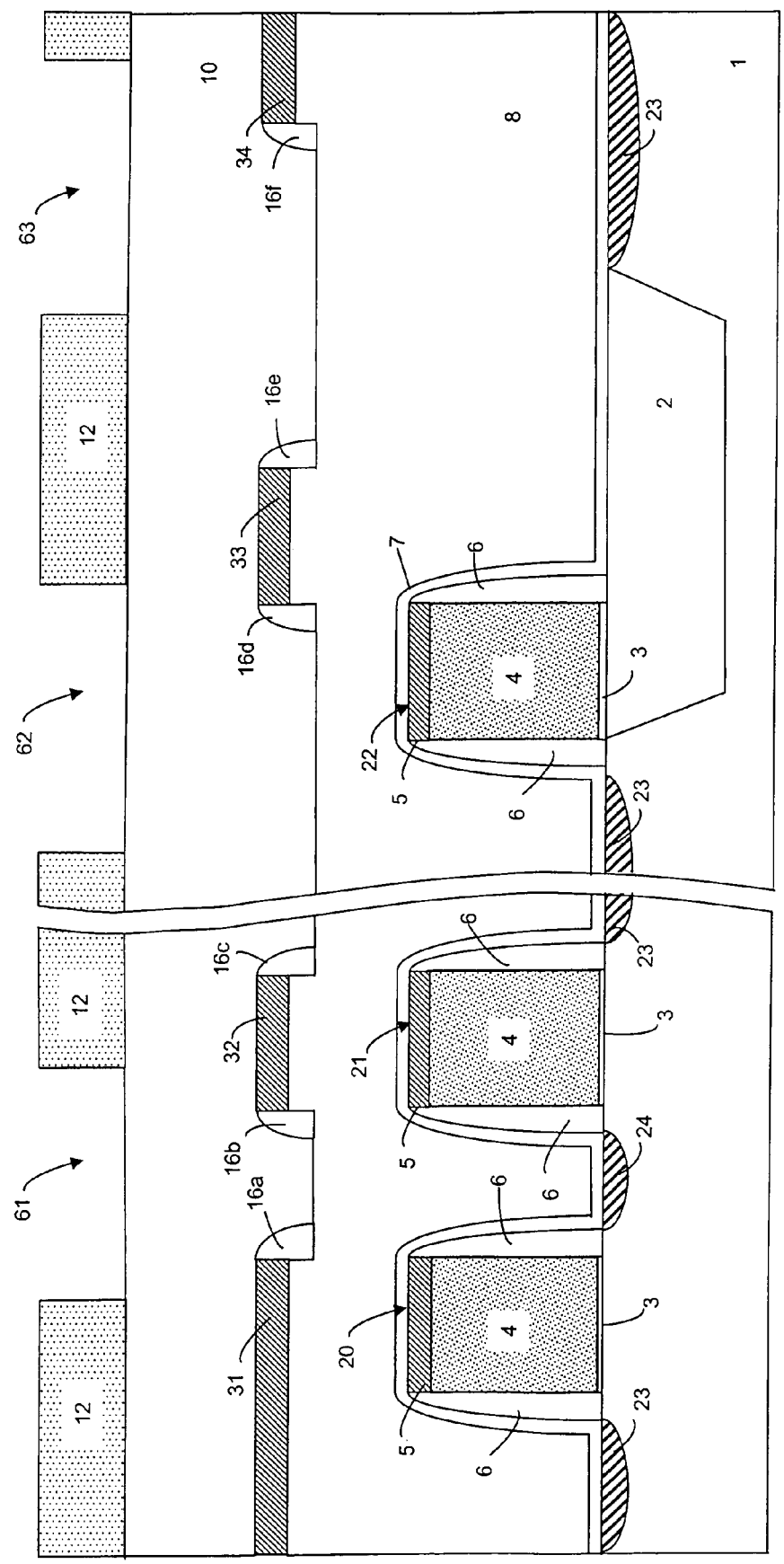
FIG. 9 shows the structure of FIG. 8 after a patterned layer of photoresist has been formed thereover that includes openings where contacts are to be formed in accordance with an embodiment of the present invention.

A masking structure is formed that defines the location of contact openings as shown by step 109. In the present embodiment the masking structure is a patterned layer of photoresist. In the embodiment shown in FIG. 9, patterned layer of photoresist 12 is shown that defines openings 61–63. Patterned layer of photoresist 12 can be formed by depositing, exposing and developing a layer of photoresist to form the desired contact pattern.

Figure 10:
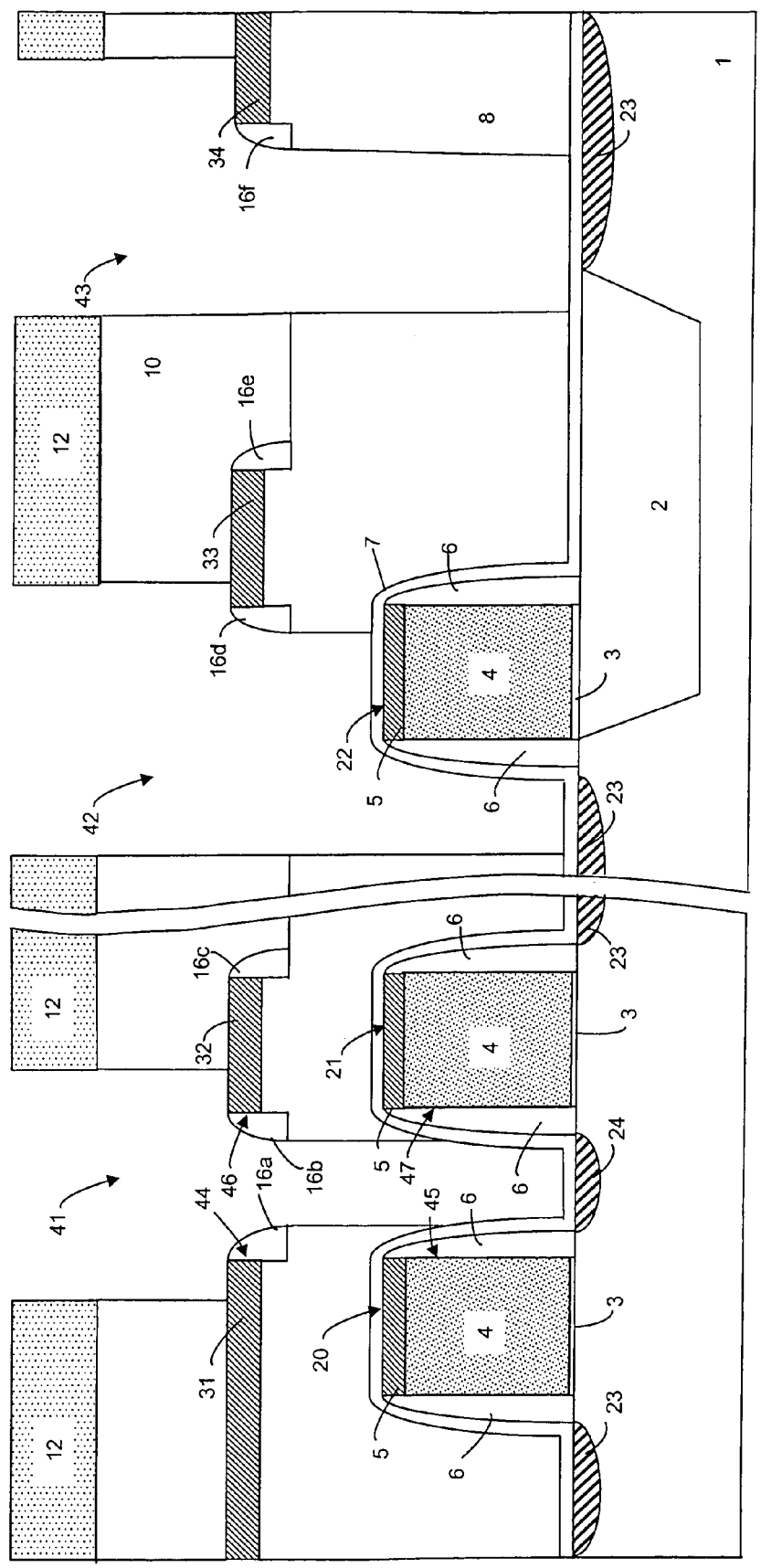
FIG. 10 shows the structure of FIG. 9 after a first selective etch has been performed so as to form contact openings that extend through the inter-metal dielectric film and through the pre-metal dielectric film in accordance with an embodiment of the present invention.

As shown by step 110, a first selective etch is performed. In the embodiment shown in FIG. 10 a selective etch is performed that preferentially removes the material in inter-metal dielectric film 10 and pre-metal dielectric film 8 over: the material in barrier layer 7, the material in metal lines 31–34 and the material in spacers 16a–f. In the present embodiment etch step 110 forms openings 41–43 that extend through inter-metal dielectric film 10 and pre-metal dielectric film 8 so as to expose portions of barrier layer 7. In one embodiment this first selective etch uses fluorine based chemistry (e.g., $C_4F_8$, $C_5F_8$, $C_2HF_5$) that is tuned to obtain a high etch rate of oxide (inter-metal dielectric film 10 and pre-metal dielectric film 8), and a low etch rate of silicon nitride (barrier layer 7 and spacers 16a–f) and aluminum-copper alloy (metal lines 31–34).

Figure 11:
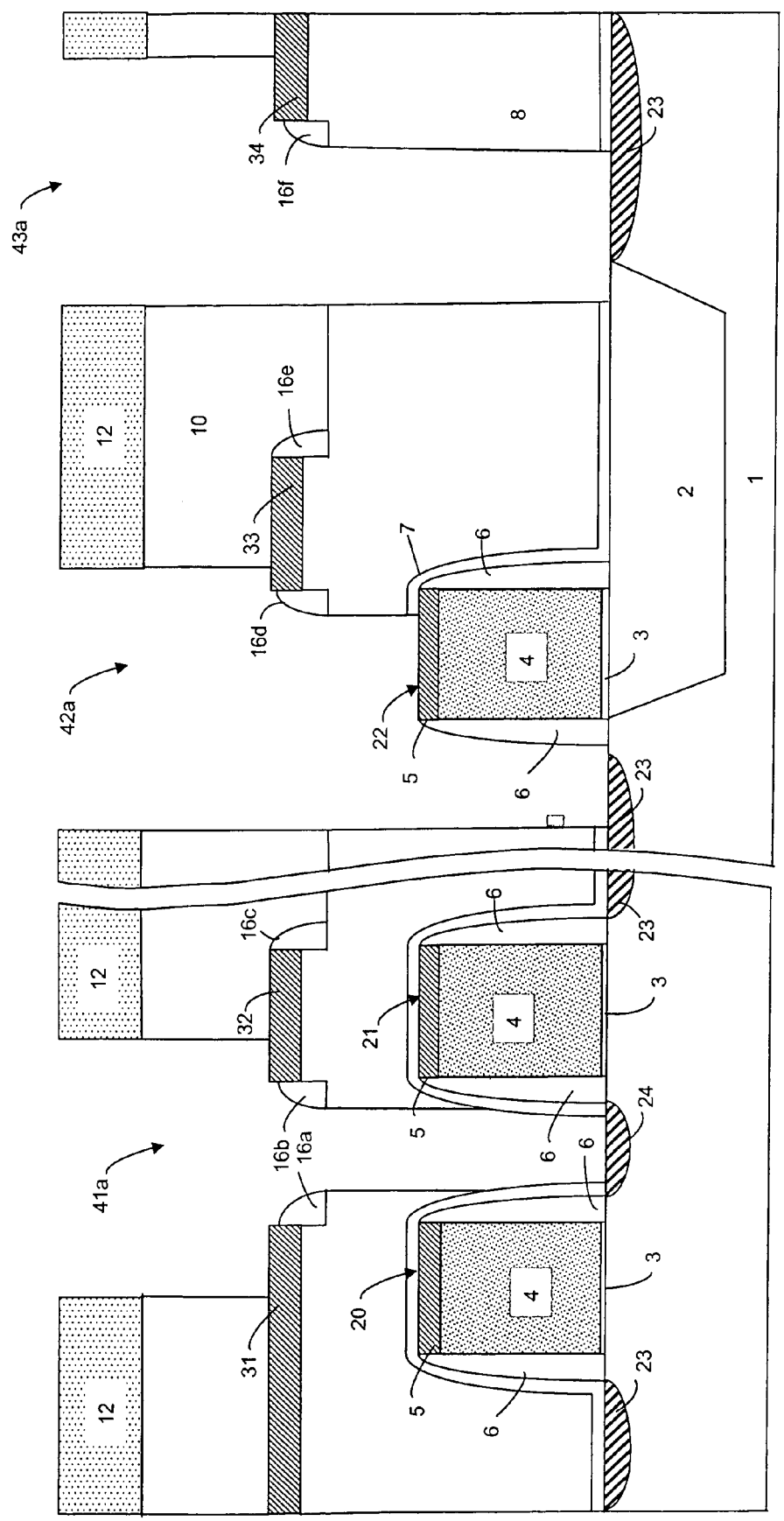
FIG. 11 shows the structure of FIG. 10 after a second etch process has been performed so as to extend the contact openings through the barrier layer in accordance with an embodiment of the present invention.

Referring now to step 111, a second selective etch step is performed. Referring now to FIG. 11, this second selective etch removes the portions of barrier layer 7 that were exposed in etch step 110, extending openings 41–43 through barrier layer 7 so as to form openings 41a, 42a and 43a. In the present embodiment a selective etch is performed that preferentially removes the material in barrier layer 7 over the material in inter-metal dielectric film 10 and pre-metal dielectric film 8. This can be a highly selective dry etch (for example, a dry etch that uses $CHF_3$ and $O_2$, $CH_3F$) that is tuned to obtain a high etch rate of silicon nitride (barrier layer 7), and a low etch rate of both oxide (inter-metal dielectric film 10 and pre-metal dielectric film 8) and aluminum-copper alloy (metal lines 31–34). Since spacers 16a–e are also formed of silicon nitride, portions of exposed spacers 16a–b and f will also be removed.

Metal lines 31–32 are aligned relative to gate film stacks 20–21 such that the etch process of steps 110–111 form a self-aligned contact opening 41a that extends between gate film stacks 20–21. More particularly, the alignment of side surface 44 of metal line 31 relative to side surface 45 of gate film stack 20 defines and limits the location of one side of the bottom portion of contact opening 41a (that portion of opening 41 that extends below spacers 16 a–b) while the alignment of side surface 46 relative to side surface 47 defines and limits the location of the other side of the bottom portion of contact opening 41. The width of spacers 16a–16b that extend between adjacent metal lines 31–32 further define and limit the location of contact opening 41a, aligning opening 41a such that the bottom portion of opening 41a extends between gate film stacks 20–21. The width of spacers 16a–16b provide additional spacing between the sides of the bottom portion of opening 41a and gate film stacks 20–21.

In one embodiment the width of spacers 16 a–b is approximately the same as the width of spacers 6, side surfaces 44 and 45 are aligned such that they extend within approximately the same vertical plane; and side surfaces 46 and 47 are aligned such that they extend within approximately the same vertical plane; thereby aligning the bottom portion of opening 41a between gate film stacks 20–21. In another embodiment, side surface 45 and 47 are aligned such they are separated by a horizontal distance that is less than or equal to a predetermined error tolerance. In this embodiment, side surfaces 44 and 46 are also aligned such they are separated by a horizontal distance that is less than or equal to the predetermined error tolerance.

The alignment provided by metal lines 31–32 allows for the use of an opening 61 in photoresist layer 12 that is wider than the spacing between adjacent gate film stacks 20–21. This forms an opening 41 that has an upper portion (that portion of opening 41a that extends above metal lines 31–32) that is wider than the lower portion of opening 41a.

In addition to forming contact opening 41a that is self-aligned on both sides, steps 110–111 simultaneously form contact opening 42a that is aligned on one side. More particularly, metal line 33 is aligned relative to gate film stack 22 such that the etch processes of steps 110–111 form a contact opening 42a that exposes both a portion of semiconductor substrate 1 and gate electrode 5 of gate film stack 22. The right side of the lower portion of contact opening 42a (that portion of opening 41a that extends below spacer 16d) is defined and limited by the alignment of the side surface of metal line 33 relative to gate film stack 22 and the width of spacer 16d, while the other side of contact opening 42 is not self-aligned. Instead, it is defined by opening 62 in patterned photoresist layer 12.

Moreover, steps 110–111 simultaneously form contact opening 43a that is aligned on one side. More particularly, metal line 34 is aligned relative to source/drain region 23 such that the etch processes of steps 110–111 form a contact opening 43a that exposes both a portion of semiconductor substrate 1 and metal line 34. The right side of the lower portion of contact opening 43a (that portion of opening 43a that extends below spacer 16f) is defined and limited by the alignment of the side surface of metal line 34 and the width of spacer 16f, while the other side of contact opening 43a is not self-aligned. Instead, it is defined by opening 63 in patterned photoresist layer 12.

The photoresist masking structure is then removed as shown by step 112. In the present embodiment patterned photoresist layer 12 is removed to give the structure shown in FIG. 12. The contact openings are then filled with conductive material as shown by step 113. In the embodiment shown in FIG. 12, one or more layers of metal or metal alloy are deposited and are planarized so as to form contacts 51–53. In one embodiment contacts 51–53 are formed by depositing tungsten and performing a chemical mechanical polishing process to remove that portion of the tungsten layer that extends over inter-metal dielectric film 10.

Figure 12:
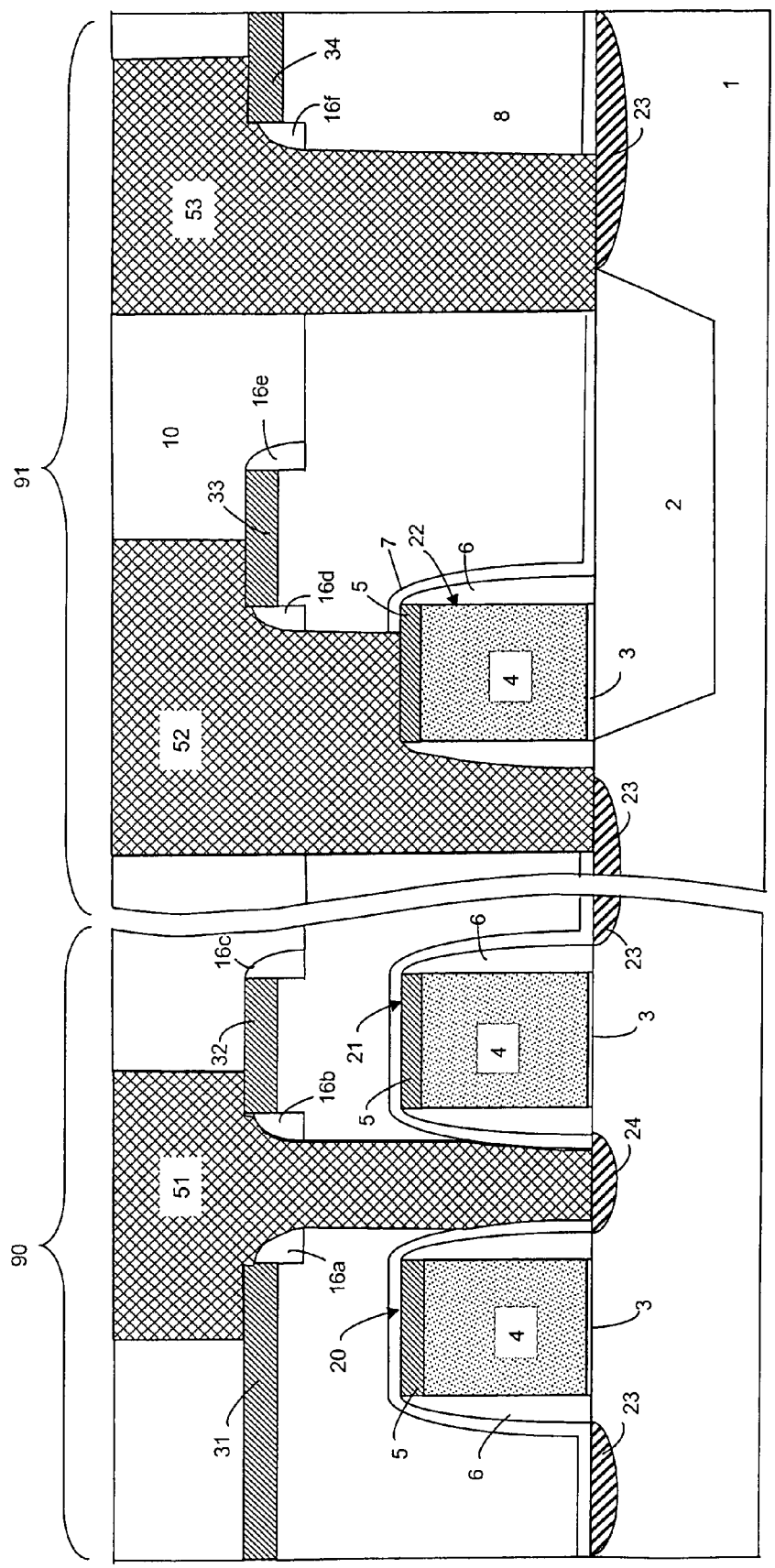
FIG. 12 shows the structure of FIG. 11 after a conductive layer has been deposited and planarized so as to form contacts in accordance with an embodiment of the present invention.

Still referring to FIG. 12, self-aligned contact 51 is formed that extends between adjacent metal lines 31–32 and between adjacent gate film stacks 20–21 that is electrically coupled to source/drain region 24. In addition, since opening 61 is wider than the distance between spacers 16a–b, that portion of contact 51 that extends above metal lines 31–32 is wider than the portion of contact 51 that extends below spacers 16a–b, electrically coupling self-aligned contact 51 to both metal line 31 and metal line 32.

Continuing with FIG. 12, strapping contact 52 is formed that includes an upper portion (that portion of strapping contact 52 that extends above metal line 33) that is wider than the bottom portion of strapping contact 52 (that portion of strapping contact 52 that extends below spacer 16d). In the present embodiment strapping contact 52 is electrically coupled to the top surface of semiconductor substrate 1 and to gate electrode 5 of gate film stack 22. In addition, self-aligned contact 52 is electrically coupled to metal line 33.

Still referring to FIG. 12, borderless contact 53 is formed that includes an upper portion (that portion of borderless contact 53 that extends above metal line 34) that is wider than the bottom portion of borderless contact 53 (that portion of contact 53 that extends below spacer 16f). In the present embodiment borderless contact 53 is electrically coupled to the top surface of semiconductor substrate 1 and to metal line 34.

Figure 13:
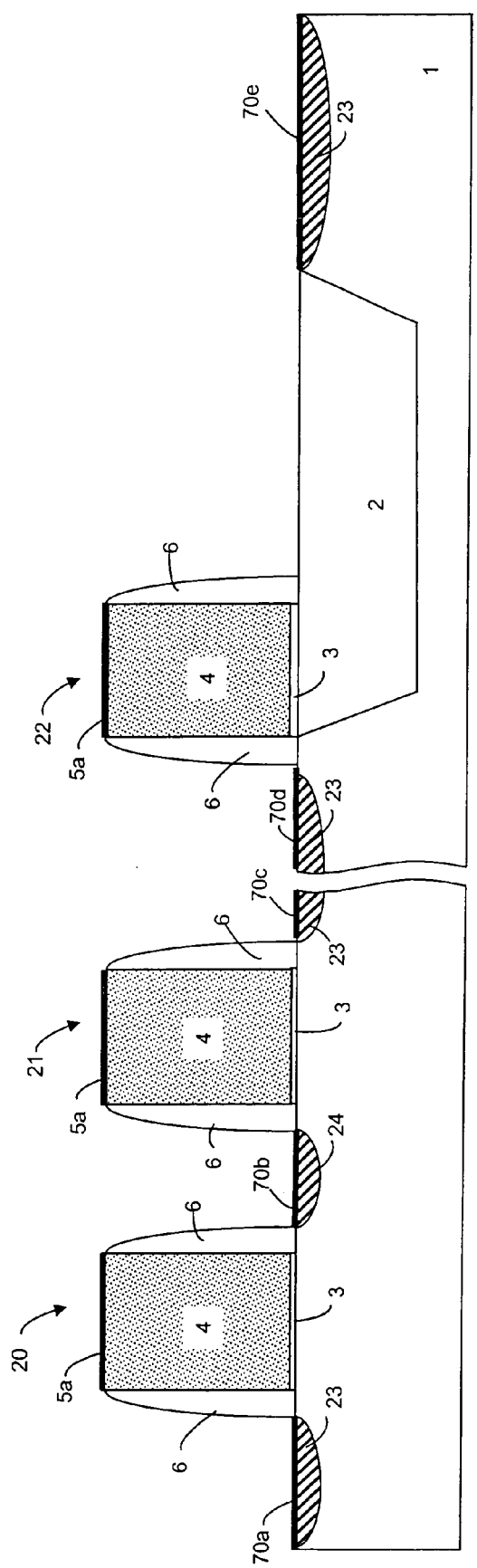
FIG. 13 shows a semiconductor substrate over which a gate dielectric layer has been deposited, after three gate film stacks have been formed thereover that include a conductive layer, after source/drain structures have been formed, and after a salicide process has been performed in accordance with an embodiment of the present invention.
Figure 14:
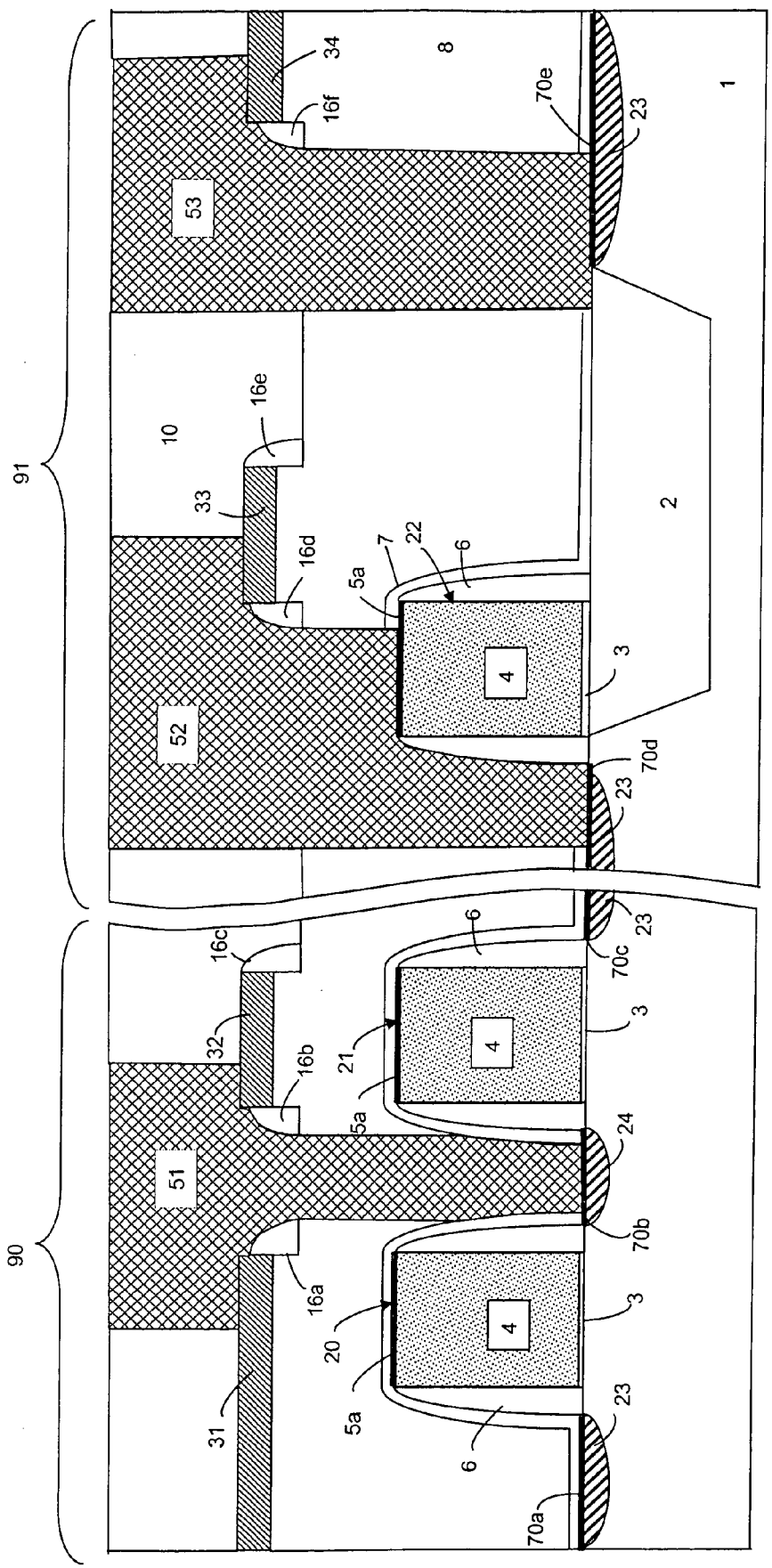
FIG. 14 shows the structure of FIG. 13 after the process of steps 104–113 have been performed so as to form contacts in accordance with an embodiment of the present invention.

In an alternate embodiment that is illustrated in FIGS. 13–14, gate electrodes are formed using a salicide process. In this embodiment, gate dielectric layer 3 and conductive layer 4 are deposited and patterned, and spacers 6 are formed prior to performing the salicide process. The salicide process is then performed by depositing a metal layer and performing an anneal process so as to form gate electrodes 5a. In the present embodiment a refractory metal is used so as to form a refractory metal silicide such as, for example, cobalt silicide, tungsten silicide, titanium silicide, tantalum silicide, molybdenum silicide, niobium silicide, rhenium silicide, vanadium silicide, chromium silicide, zirconium silicide or hafnium silicide. In addition to forming gate electrode 5a, the salicide process will form silicide segments 70a–e that extend immediately overlie semiconductor substrate 1. Steps 104–113 are then performed in the same manner as in the embodiment shown in FIGS. 2–12, forming a self-aligned contact 51 that is electrically coupled to silicide segment 70b and metal lines 31–32. Also, strapping contact 52 will be formed that is electrically coupled to silicide segment 70d, to gate electrode 5a and to metal line 33. In addition, borderless contact 53 will be formed that is electrically coupled to silicide segment 70e and to metal line 34.

The self-alignment provided by metal lines 31–32 and spacers 16a–16b prevents shorting to gate electrodes 5 and 5a. Accordingly, gate film stacks 20–21 do not require a cap layer as is required in prior art processes for forming self-aligned contacts, allowing for the use of gate film stacks 20–21 that are shorter than prior art gate film stacks that include a capping layer that extends over the gate electrode. This reduced height, giving good gap-fill when gate film stacks are closely spaced together (e.g., gate film stacks 20–21), preventing void formation that can cause bridging defects. In addition, since gate film stacks 20–22 do not include a capping layer, there is no need remove a capping layer in order to contact gate electrodes as is required in prior art self-aligned contact processes.

In one embodiment adjacent gate film stacks 20–21 are formed in a core region 90 and gate film stack 22 is formed in a different region of the semiconductor substrate, referred to hereinafter as non-core region 91. In the present embodiment all of the gate film stacks in the core region 90 are spaced more closely together than the gate film stacks in non-core region 91. In the present embodiment the gate film stacks in core region 90 are spaced so closely together that self-aligned contacts are required for connection to the semiconductor substrate between adjacent gate film stacks. In contrast, the spacing between gate film stacks in non-core region 91 is greater such that self-aligned contacts are not required for connection to the semiconductor substrate between gate film stacks in non-core region 91.

In the present embodiment the gate structures within core region 90 are more closely spaced than the gate structures within non-core region 91. In one embodiment the gate structures are so closely spaced that self-aligned contact process are required for assuring that contacts to source and drain structures in core region 90 do not short to adjacent gate electrodes. This close spacing of gate structures gives high device density in core region 90. In one embodiment core region 90 includes substantially replicated cells and non-core region 91 includes control logic that is electrically coupled to the circuitry of core region 90. In one embodiment, the gate film stacks in core region 90 have a width of 1,400 Angstroms or less and adjacent gate film stacks are separated by a distance of 2,000 Angstroms or less.

In the embodiment shown in FIGS. 2–14 contacts 52–53 are shown to be aligned on one side by one of metal lines 33–34. However, it is appreciated that, alternatively, contacts could be formed in accordance with the methods of the present invention that are not aligned on either side by a metal line 33–34. For example, the etch process of steps 110–111 can form, in addition to self-aligned contact 51, shared contacts, borderless contacts and strapping contacts in non-core region 91 that are not aligned on one side. Moreover, the methods of the present embodiment can be used to form borderless contacts and strapping contacts within core region 90.

The methods of the present invention allow for coupling contacts 51–53 to both metal lines 31–34 in the first metal layer and to overlying conductive layers. This provides flexibility in that metal lines 31–34 can be used to connect contacts 51–53 to other circuitry. Alternatively some or all of metal lines 31–34 can be used simply for alignment, whereupon they will not be coupled to other circuitry.

The preferred embodiment of the present invention is thus described. While the present invention has been described in particular embodiments, it should be appreciated that the present invention should not be construed as limited by such embodiments, but rather construed according to the following claims.

What is claimed is:

1. For a structure that includes adjacent gate film stacks that include gate electrodes, a barrier layer that overlies said adjacent gate film stacks, and a first dielectric film that extends over said barrier layer, a process for forming a CMOS device comprising:

forming adjacent metal lines that extend over said first dielectric film;

forming spacers that extend on opposite sides of said metal lines;

forming a second dielectric film that extends over said spacers and over said adjacent metal lines;

forming an opening so as to expose a portion of said semiconductor substrate, said opening extending between adjacent metal lines and between said adjacent gate film stacks, portions of said adjacent metal lines aligned with said adjacent gate film stacks so as to align said opening between said adjacent gate film stacks; and filling said opening with conductive material so as to form a self-aligned contact that is electrically coupled to said semiconductor substrate.

2. The process of claim 1 wherein said forming an opening comprises:

forming a patterned photoresist layer that extends over said second dielectric film, said patterned photoresist layer including an opening, some of said opening extending between said adjacent metal lines;

performing a first selective etch so as form an opening that extends through said first dielectric film so as to expose a portion of said barrier layer; and performing a second selective etch so as to extend said opening through said barrier layer.

3. The process of claim 2 wherein said first selective etch preferentially etches the material in said first and second dielectric films, over the material in said barrier layer and in said spacers, such that said opening extends between ones of said spacers.

4. The process of claim 3 wherein said spacers and said barrier layer comprise nitride, and wherein said first and second dielectric films comprises oxide.

5. The process of claim 1 wherein each of said adjacent gate film stacks include a gate electrode and do not include a hard mask layer that overlies said gate electrode.

6. The process of claim 5 wherein said adjacent gate film stacks extend within a first region of said semiconductor substrate, said process further comprising:

forming a plurality of additional gate film stacks within a second region of said semiconductor substrate, said gate film stacks in said first region of said semiconductor substrate spaced more closely together than said additional gate film stacks.

7. The process of claim 6 wherein said forming an opening further comprises simultaneously forming additional openings that extend within said second region of said semiconductor substrate.

8. The process of claim 7 wherein said forming adjacent metal lines further comprises forming additional metal lines that extend in said second region of said semiconductor substrate, said additional openings exposing portions of said additional metal lines, said filling said opening filling said additional openings so as to form additional contacts that are electrically coupled to said additional metal lines.

9. For a structure that includes gate film stacks that include gate electrodes, a barrier layer that overlies said gate film stacks, and a first dielectric film that extends over said barrier layer, a process for forming a CMOS device comprising:

forming adjacent metal lines that extend over said first dielectric film;

forming spacers that extend on opposite sides of said metal lines;

forming a second dielectric film that extends over said spacers and over said adjacent metal lines;

forming a masking structure that extends over said second dielectric film, said masking structure including a first opening that at least partially extends between said adjacent metal lines;

performing a first selective etch so as to form an opening that extends through said first and second dielectric films so as to expose a portion of said barrier layer;

performing a second selective etch so as to extend said opening through said barrier layer to expose a portion of said semiconductor substrate, said adjacent metal lines aligned with said adjacent gate film stacks such that said opening extends between said adjacent gate film stacks; and filling said opening with conductive material so as to form a self-aligned contact that is electrically coupled to said semiconductor substrate.

10. The process of claim 9 wherein said filling said opening with conductive material further comprises:

depositing a metal layer over said semiconductor substrate such that said metal layer fills said opening; and removing that portion of said metal layer that extends above said second dielectric film.

11. The process of claim 9 wherein said first selective etch preferentially etches the material in said first and second dielectric films, over the material in said barrier layer and in said spacers.

12. The process of claim 11 wherein said spacers and said barrier layer comprise nitride, and wherein said first and second dielectric films comprises oxide.

13. The process of claim 9 wherein said adjacent gate film stacks do not include a hard mask layer that overlies said gate electrode.

14. The process of claim 13 wherein said adjacent gate film stacks extend within a first region of said semiconductor substrate, said process further comprising:

forming a plurality of additional gate film stacks within a second region of said semiconductor substrate, said gate film stacks in said first region of said semiconductor substrate spaced more closely together than said additional gate film stacks.

15. The process of claim 14 wherein said forming an opening further comprises simultaneously forming additional openings that extend within said second region of said semiconductor substrate.

16. The process of claim 15 wherein said first region comprises a core region and said second region comprises a non-core region, said step of filling said contact opening further comprising filling said additional contact openings so as to form strapped contacts, borderless contacts, and shared contacts in said second region of said semiconductor substrate.

\* \* \* \* \*

UNITED STATES PATENT AND TRADEMARK OFFICE
CERTIFICATE OF CORRECTION

| | |
|---|---|
| PATENT NO. | : 7,037,774 B1 |
| APPLICATION NO. | : 10/970074 |
| DATED | : May 2, 2006 |
| INVENTOR(S) | : Syau |

It is certified that error appears in the above-identified patent and that said Letters Patent is hereby corrected as shown below:

Column 4, line 26, both occurrences of the word "suicides" should read --silicides--.

Signed and Sealed this

Twentieth Day of March, 2007

JON W. DUDAS
*Director of the United States Patent and Trademark Office*